United States Patent [19]

Spellman et al.

[11] 4,355,322

[45] Oct. 19, 1982

[54] INTEGRATED GATE TURN-OFF DEVICE HAVING A VERTICAL POWER TRANSISTOR FORMING A REGENERATIVE LOOP WITH A LATERAL TRANSISTOR

[76] Inventors: Gordon B. Spellman; Herman P. Schutten; Stanley V. Jaskolski, all of 4201 N. 27th St., P.O. Box 463, Milwaukee, Wis. 53201

[21] Appl. No.: 184,844

[22] Filed: Sep. 8, 1980

Related U.S. Application Data

[63] Continuation of Ser. No. 972,442, Dec. 22, 1978, abandoned.

[51] Int. Cl.[3] .......................................... H01L 29/74
[52] U.S. Cl. ...................................... 357/38; 357/34; 357/35; 307/252 A; 307/252 C; 307/305
[58] Field of Search ............................ 357/38, 35, 34; 307/252 A, 252 C, 305

[56] References Cited

U.S. PATENT DOCUMENTS

| | | | |
|---|---|---|---|
| 3,524,113 | 8/1970 | Agusta et al. | 357/35 |
| 3,979,766 | 9/1976 | Tsuyuki | 357/38 |
| 4,015,143 | 3/1977 | Tokunaga et al. | 307/252 A |
| 4,112,315 | 9/1978 | Ohhinata | 307/252 C |

*Primary Examiner*—Joseph E. Clawson, Jr.

[57] ABSTRACT

A monolithically integrated gate turn-off device is disclosed comprising a vertical power transistor collector-base connected with a lateral transistor to form a regenerative loop. The device is turned on by signal current of one polarity applied to the base of the power transistor driving the latter into conduction, and remains ON upon removal of the signal current due to base drive supplied by the collector of the other transistor in the regenerative loop. The device is turned OFF by signal current of opposite polarity breaking the regenerative loop.

3 Claims, 2 Drawing Figures

INTEGRATED GATE TURN-OFF DEVICE HAVING A VERTICAL POWER TRANSISTOR FORMING A REGENERATIVE LOOP WITH A LATERAL TRANSISTOR

This is a Continuation of Application Ser. No. 972,442 filed Dec. 22, 1978, now abandoned.

BACKGROUND OF THE INVENTION

Gate turn-off devices are known in the art. Generally, a thyristor can be turned on with a small gating signal of one polarity, say positive. Since a thyrisor is a regenerative element, it will stay conductive above a certain minimum holding current flowing between its main terminals, even if gate drive is removed. Such thyristor can typically be turned off by a negative gating signal. For low level conduction current through the thyristor, say only slightly above the minimum holding current, only a small negative gating signal is necessary to turn it off. However, when the thyristor is conducting heavily with a high amount of current flow therethrough, turn-off is difficult or impossible and requires a substantially larger negative gating signal.

Numerous schemes are known for accomplishing turn-off. One approach is to supply the requisite high level off signal by means of a short duration, high level pulse, for example by capacitor discharge.

Another approach is to attack the problem from a different angle and attempt to reduce the requisite magnitude of the off signal necessary to achieve turn-off. For example, rather than using a thyristor alone as the power switching element, it is instead used as a low level regeneration element to control a non-regenerative power element (i.e. continual gating or driving current is necessary to maintain conduction). The thyristor is connected to drive the power element into conduction such that the latter carries load current and the thyristor carries only a small on current which is above its minimum holding value and which is also above the minimum driving current necessary to maintain continued conduction of the power element. It is thus generally known to employ the combination of a low level regeneration element controlling a high current capacity non-regenerative element in order to achieve high turn-off gain by breaking the regenerative loop with a low level signal.

Another approach is to effectively split the thyristor into its two composite transistors and have one of them be a power transistor carrying most of the load current, but retain the regenerative coupling between the transistors. The regenerative loop current between the composite transistors drives the base of the power transistor and is kept at a low level to facilitate turn-off.

SUMMARY OF THE INVENTION

The present invention relates to improvements in the last mentioned approach, and is specifically directed to an integrated circuit wherein the power transistor is vertical and the other composite transistor is lateral.

DESCRIPTION OF THE PREFERRED EMBODIMENT

Figure 1:
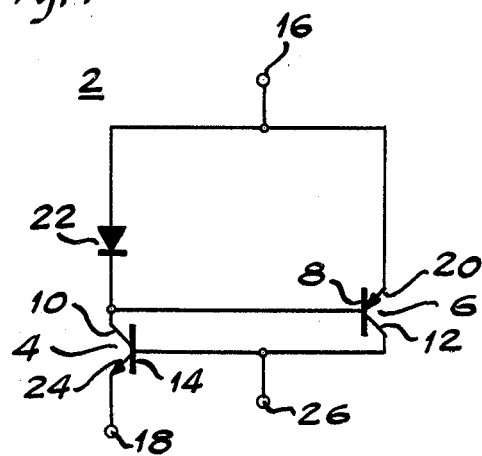
FIG. 1 is a circuit diagram of a gate turn-off device constructed in accordance with the invention.
Figure 2:
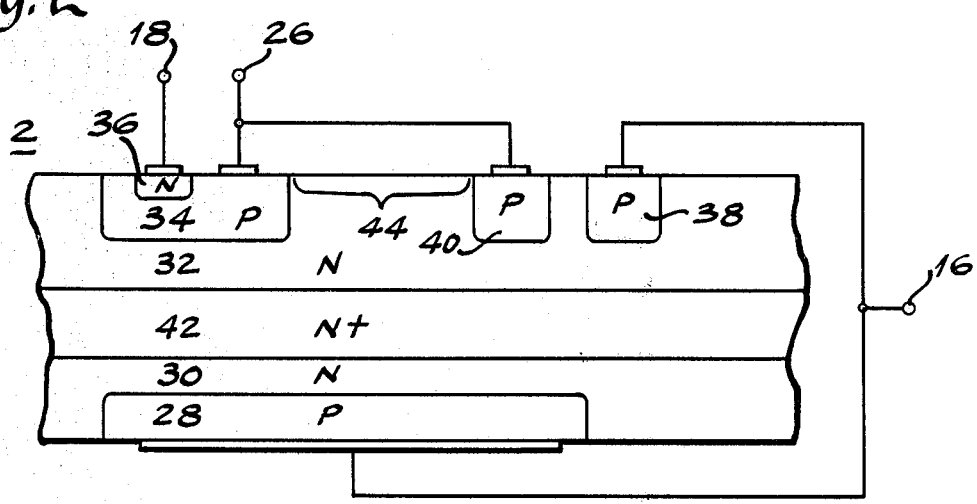
FIG. 2 is a substrate drawing of the device of FIG. 1.

There is shown in FIGS. 1 and 2 an integrated gate turn-off device, generally designated by the reference character 2. Referring to FIG. 1, a pair of regeneratively coupled transistors 4 and 6 are provided by connecting base 8 to collector 10, and collector 12 to base 14 as shown. The device has a pair of main terminals 16 and 18 for carrying load current. Main anode terminal 16 is connected to emitter 20 of PNP transistor 6, and is also connected through diode 22 to collector 10 of NPN transistor 4. Main cathode terminal 18 is connected to emitter 24 of transistor 4.

Device 2 is turned ON by applying a positive gating signal current to control terminal 26 which is connected to base 14 of transistor 4 whereby the latter is driven into conduction. Conduction of transistor 4 draws current out of base 8 of transistor 6 rendering the latter conductive which in turn now supplies base drive to transistor 4 thus completing the regenerative coupling, and hence device 2 will stay ON after removal of signal current from control terminal 26. Load current flows through diode 22 and transistor 4 between main terminals 16 and 18.

Device 2 is turned OFF by applying a negative signal at control terminal 26. This breaks the regenerative loop, thus terminating base drive to transistor 4 whereby the latter is rendered non-conductive and no load current flows between terminals 16 and 18.

FIG. 2 shows the integrated configuration of device 2. P region 28 and N region 30 form diode 22. N region 32, P region 34 and N region 36 form collector, base and emitter, respectively, of NPN power transistor 4. P region 38, N region 32 and P region 40 form emitter, base and collector, respectively, of PNP transistor 6. N+ substrate region 42 prevents vertical SCR action between diode 22 and transistor 4 due to the low minority carrier lifetime in the N+ region, and also enables low saturation resistance for transistor 4. The lateral dimension 44 between regions 34 and 40 reduces to a negligible level any parasitic interaction between transistors 6 and 4. Regions 28 and 38 are ohmically connected to main anode terminal 16, region 36 is ohmically connected to main cathode terminal 18, and regions 40 and 34 are ohmically connected to control terminal 26.

In the ON state of device 2, the majority of current from main anode terminal 16 flows through transistor 4 rather than to transistor 6. This may be accomplished by any suitable means, such as a discrete resistance in the ohmic connection between terminal 16 and region 38, or design of the PN junction area, or a series resistance formed by a laterally extended dimension of region 38, etc. With such current diversion through transistor 4, turn-off is easier because of the lower regenerative loop current.

What is claimed is:
1. A monolithically integrated gate turn-off semi-conductor switching device comprising:
   a pair of main terminals for carrying load current;
   a control terminal which enable said device to be turned On by signal current of one polarity and be turned OFF by a signal current of the opposite polarity;
   first non-regenerative switch means comprising a power transistor vertically formed in a substrate by first, second and third regions of alternating conductivity types, a diode formed by fourth and fifth regions of opposite conductivity types in series with the aforementioned regions of said vertical transistor but separated therefrom by a sixth region of said substrate doped to provide low minority carrier lifetime therein and prevent vertical regenerative action between said diode and said vertical transistor;

said fourth region of said diode being disposed on a bottom surface of said substrate and ohmically connected to one of said main terminals and;

said third region of said vertical transistor being disposed on the top surface of said substrate and ohmically connected to the other of said main terminals;

second non-regenerative switching means comprising a transistor laterally formed in said substrate by said first region of said vertical transistor, and by a seventh region and an eighth region of alternating conductivity types, said eighth region being disposed on the top surface of said substrate and ohmically connected to said second region of said vertical transistor for delivering base drive current to the latter region when base drive current is applied to the common first region of said first and second switching means, said second non-regenerative switching means being non-conductive in the absence of the last mentioned base drive current;

said common first region of said vertical and lateral transistors having a portion disposed on said top surface of said substrate between said eighth region of said lateral transistor and said second region of said vertical transistor of laterally extended dimension to reduce to a negligible level parasitic interaction between said transistors; and said control terminal being connected to said second region of said vertical transistor and said eighth region of said lateral transistor to provide a regenerative coupling between said first and second non-regenerative switching means such that application of said signal current of said one polarity to said control terminal initiates regenerative loop current between said first and second individually non-regenerative switching means to maintain conduction of said first such switching means upon removal of said signal current of said one polarity;

said first such switching means upon application of a small signal current of said opposite polarity to said control terminal being turned OFF by interruption of base drive to its said second region.

2. The invention according to claim 1 wherein said first, third, fifth and sixth regions are all of the same conductivity type, and said second, fourth, seventh and eighth regions are of the opposite conductivity type, and wherein said sixth region of said one conductivity type is doped differently from the other specified regions of that type to provide low minority carrier lifetimes in that region to prevent regenerative action between said diode and said vertical transistor.

3. The invention according to claim 2 wherein said first, third, and fifth regions are of the "N" conductivity type, said sixth region is of the "N+" conductivity type, and said second, fourth, seventh and eighth regions are of the "P" conductivity type.

* * * * *